US012604614B2

(12) United States Patent
Jeon et al.

(10) Patent No.: US 12,604,614 B2
(45) Date of Patent: Apr. 14, 2026

(54) DISPLAY APPARATUS

(71) Applicant: LG Display Co., Ltd., Seoul (KR)

(72) Inventors: YoungHo Jeon, Paju-si (KR); Yuseok Jung, Paju-si (KR); Yoonseob Jeong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 757 days.

(21) Appl. No.: 17/874,148

(22) Filed: Jul. 26, 2022

(65) Prior Publication Data

US 2023/0032631 A1 Feb. 2, 2023

(30) Foreign Application Priority Data

Jul. 30, 2021 (KR) ........................ 10-2021-0100913

(51) Int. Cl.
*H10K 59/122* (2023.01)
*H10K 59/80* (2023.01)
*H10K 59/88* (2023.01)

(52) U.S. Cl.
CPC ......... *H10K 59/122* (2023.02); *H10K 59/873* (2023.02); *H10K 59/8731* (2023.02); *H10K 59/88* (2023.02)

(58) Field of Classification Search
CPC .. H10K 50/844; H10K 59/122; H10K 59/873; H10K 59/8731; H10K 59/88; H10K 50/81; H10K 59/124; H10K 59/35
See application file for complete search history.

(56) References Cited

U.S. PATENT DOCUMENTS

| | | | | |
|---|---|---|---|---|
| 2019/0181373 A1* | 6/2019 | Kim | ...................... | H10K 50/82 |
| 2020/0381653 A1* | 12/2020 | Bang | .................... | H10K 59/122 |
| 2021/0200357 A1* | 7/2021 | Lee | ...................... | G06F 3/0446 |
| 2021/0202676 A1* | 7/2021 | Jeong | .................... | G06F 3/1446 |
| 2021/0202895 A1* | 7/2021 | Kang | .................. | H10K 50/844 |
| 2022/0059798 A1* | 2/2022 | Song | .................... | H10K 59/124 |
| 2023/0172009 A1* | 6/2023 | Yang | .................. | H10K 59/1213 |
| | | | | 257/40 |

FOREIGN PATENT DOCUMENTS

KR 20200025582 A 3/2020

* cited by examiner

*Primary Examiner* — Shaun M Campbell

(57) ABSTRACT

A display apparatus is provided, which reduces a size of a non-display area while preventing encapsulation characteristics from being deteriorated. The display apparatus comprises a substrate including a display area having a plurality of pixels and a non-display area adjacent to the display area and having a dam spaced apart from the plurality of pixels, a flat portion provided below a pixel electrode of each of the plurality of pixels, and a bank covering an edge of the pixel electrode, wherein the bank includes a first bank disposed between the flat portion adjacent to the dam and the dam, and a thickness of the first bank is thinner than or equal to a thickness of the flat portion adjacent to the dam.

19 Claims, 7 Drawing Sheets

DISPLAY APPARATUS

CROSS-REFERENCE TO RELATED APPLICATION

This application claims the benefit of the Korean Patent Application No. 10-2021-0100913 filed on Jul. 30, 2021, which is hereby incorporated by reference as if fully set forth herein.

BACKGROUND

Technical Field

The present disclosure relates to a display apparatus for displaying an image.

Description of the Related Art

With the advancement of the information age, the demand for a display apparatus for displaying an image has increased with various forms. Accordingly, various types of display apparatuses such as a liquid crystal display (LCD), a plasma display panel (PDP), an organic light emitting display (OLED) and a quantum dot light emitting display (QLED) have been recently used.

Among the display apparatuses, the organic light emitting display (OLED) and the quantum dot light emitting display (QLED) are self-light emitting types and have advantages in that a viewing angle and a contrast ratio are more excellent than those of the liquid crystal display (LCD). Also, since the organic light emitting display (OLED) and the quantum dot light emitting display (QLED) do not require a separate backlight, it is advantageous that the organic light emitting display (OLED) and the quantum dot light emitting display (QLED) are able to be thin and lightweight and have low power consumption.

Such an organic light emitting display apparatus is likely to generate foreign materials such as particles in the process of manufacturing a substrate including pixels, and such foreign materials may cause cracks in the substrate, whereby a light emitting element may be damaged by permeation of external moisture or moisture. Accordingly, an organic material capable of covering foreign materials on the substrate may be coated on the substrate to prevent cracks from occurring in the substrate due to the foreign materials, wherein the organic material is coated in a liquid state.

In order to prevent such a liquid organic material from overflowing to the outside beyond an edge (or non-display area) of the substrate, a dam is provided at the edge of the substrate, and a coating device for coating the liquid organic material is positioned between the dam and a pixel adjacent to the dam to coat the liquid organic material.

BRIEF SUMMARY

The inventors have realized that, when the coating device fails to coat the liquid organic material at the exact position between the dam and the pixel, the liquid organic material is not coated on the non-display area of the substrate or flows to the outside of the substrate, which increases a defect rate. For this reason, the coating area of the organic material between the dam and the pixel may have a constant size (or area). This results in a problem in reducing the size of the non-display area.

The present disclosure has been made in view of the above problems and it is a technical benefit of the present disclosure to provide a display apparatus that may reduce a size of a non-display area while preventing encapsulation characteristics from being deteriorated.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a display apparatus comprising a substrate including a display area having a plurality of pixels and a non-display area either adjacent to or laterally surrounding the display area and having a dam spaced apart from the plurality of pixels, a flat portion provided below a pixel electrode of each of the plurality of pixels, and a bank covering an edge of the pixel electrode, wherein the bank includes a first bank disposed between the flat portion adjacent to the dam and the dam, and a thickness of the first bank is thinner than or equal to a thickness of the flat portion adjacent to the dam.

In accordance with another aspect of the present disclosure, the above and other technical benefits can be accomplished by the provision of a display apparatus comprising a substrate including a display area having a plurality of pixels and a non-display area either adjacent to or laterally surrounding the display area and having a dam spaced apart from the plurality of pixels, a flat portion provided below a pixel electrode of each of the plurality of pixels, and a bank covering an edge of the pixel electrode, wherein the bank includes a first bank disposed between the flat portion adjacent to the dam and the dam, and a thickness of the flat portion adjacent to the dam is thinner than a thickness of the dam and is thicker than or equal to a thickness of the first bank.

In accordance with other aspect of the present disclosure, the above and other technical benefits can be accomplished by the provision of a display apparatus comprising a substrate, and a display area having a plurality of pixels disposed on the substrate, wherein the display area includes a light emission area in which the plurality of pixels are disposed, a non-light emission area other than the light emission area, and a dam disposed in a non-light emission area and laterally surrounding the outermost pixel of the plurality of pixels.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
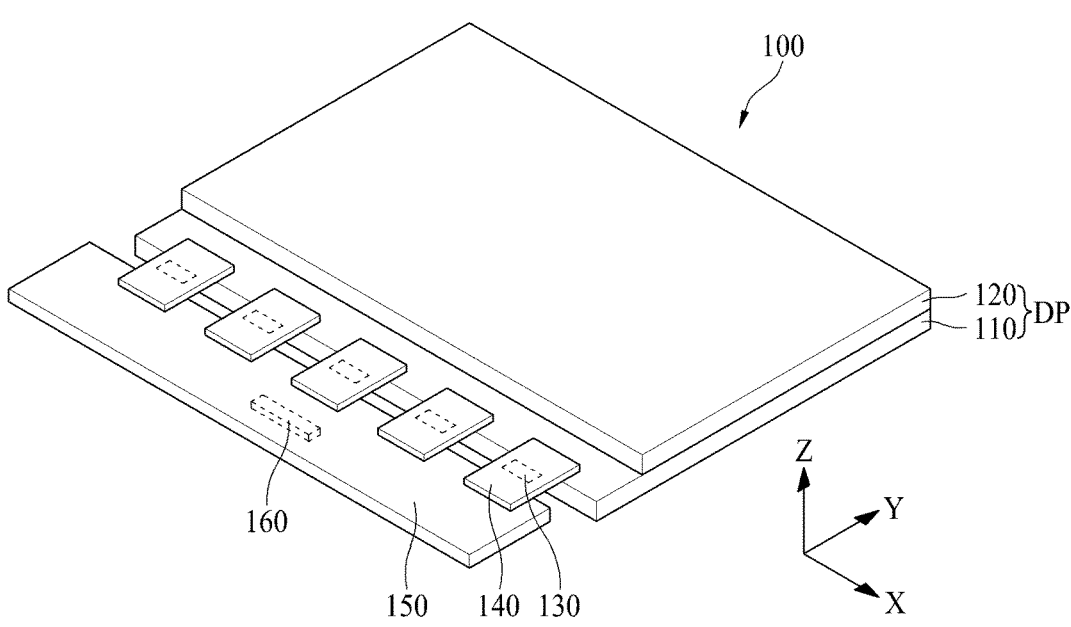
FIG. 1 is a perspective view illustrating a display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, the preferred embodiments of the present disclosure will be described in detail with reference to the accompanying drawings.

Figure 2:
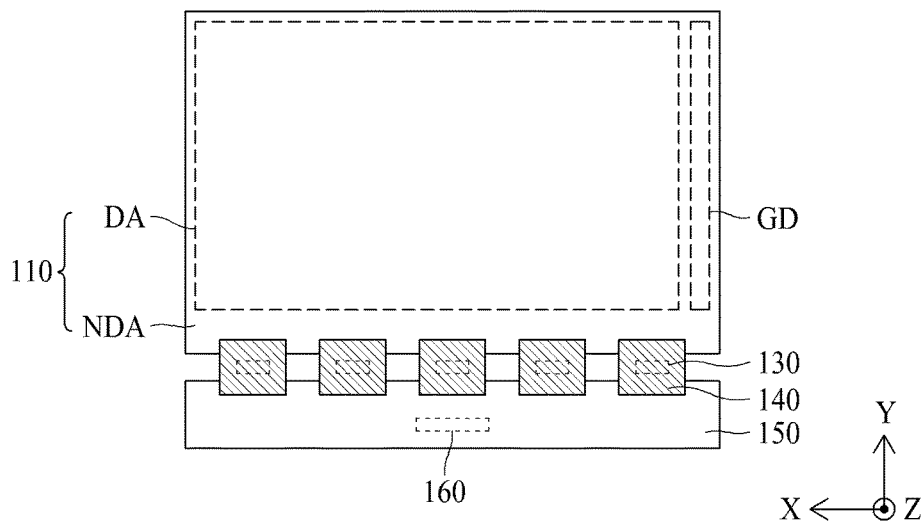
FIG. 2 is a plan view illustrating a first substrate, a source drive IC, a flexible film, a circuit board and a timing controller of FIG. 1.
Figure 3:
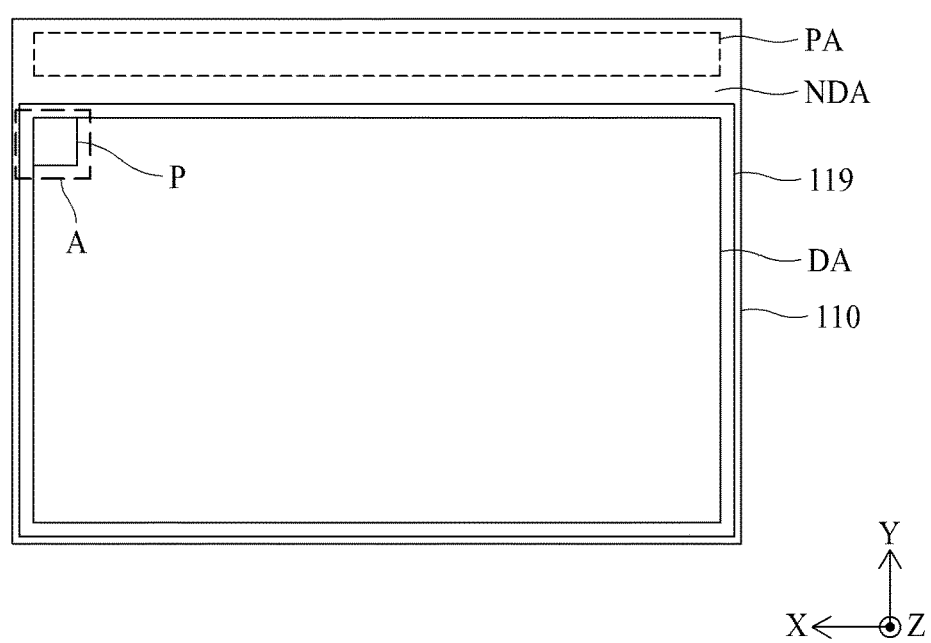
FIG. 3 is a schematic plan view illustrating the first substrate.
Figure 4:
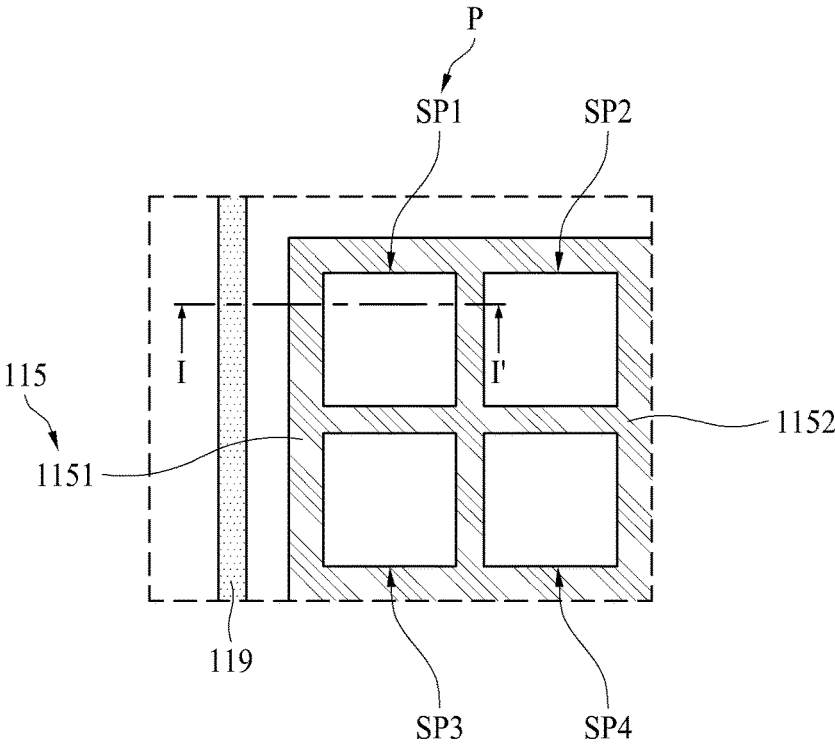
FIG. 4 is a schematic enlarged view illustrating a portion A of FIG. 3.
Figure 5:
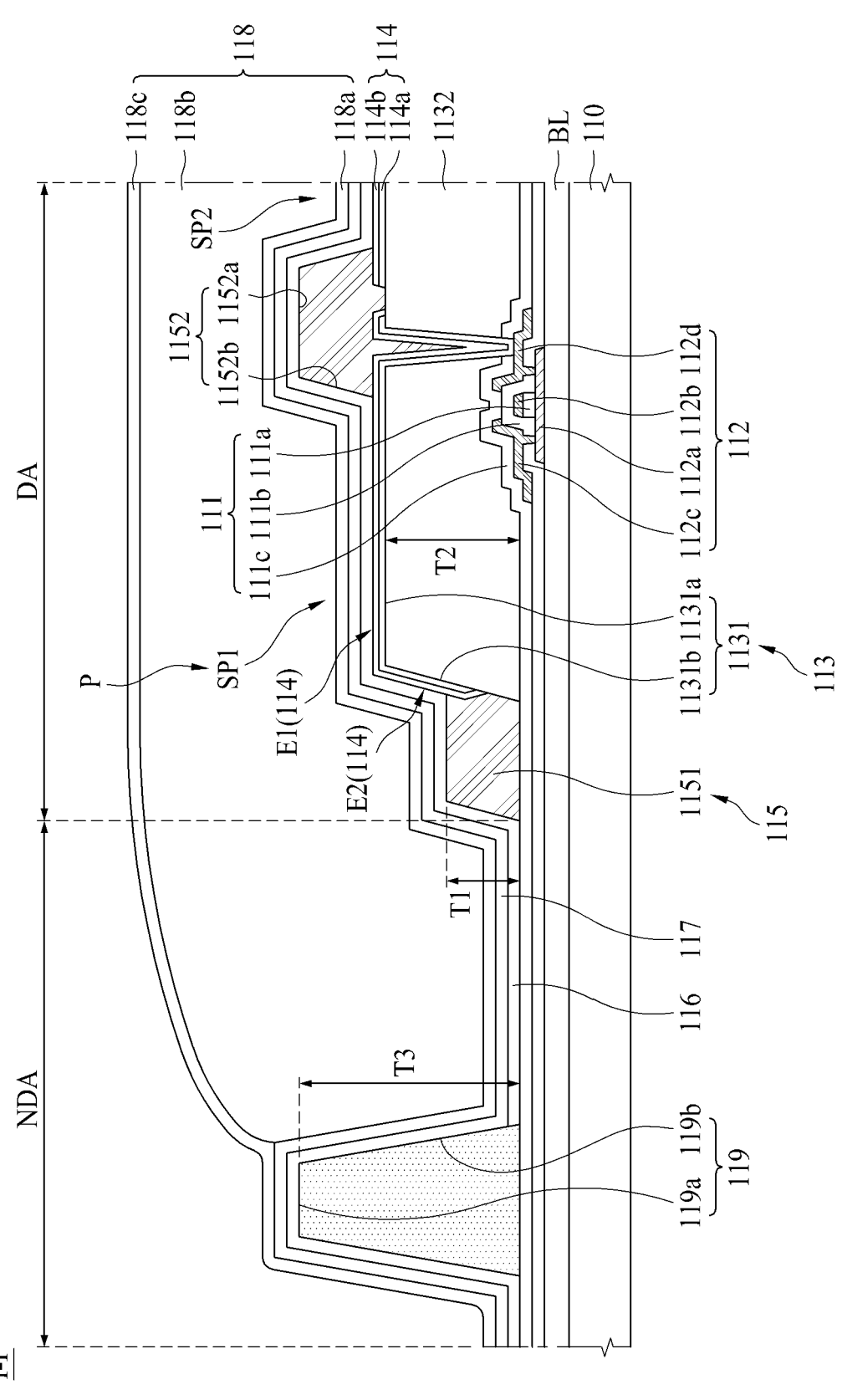
FIG. 5 is a schematic cross-sectional view taken along line I-I' shown in FIG. 4.
Figure 6:
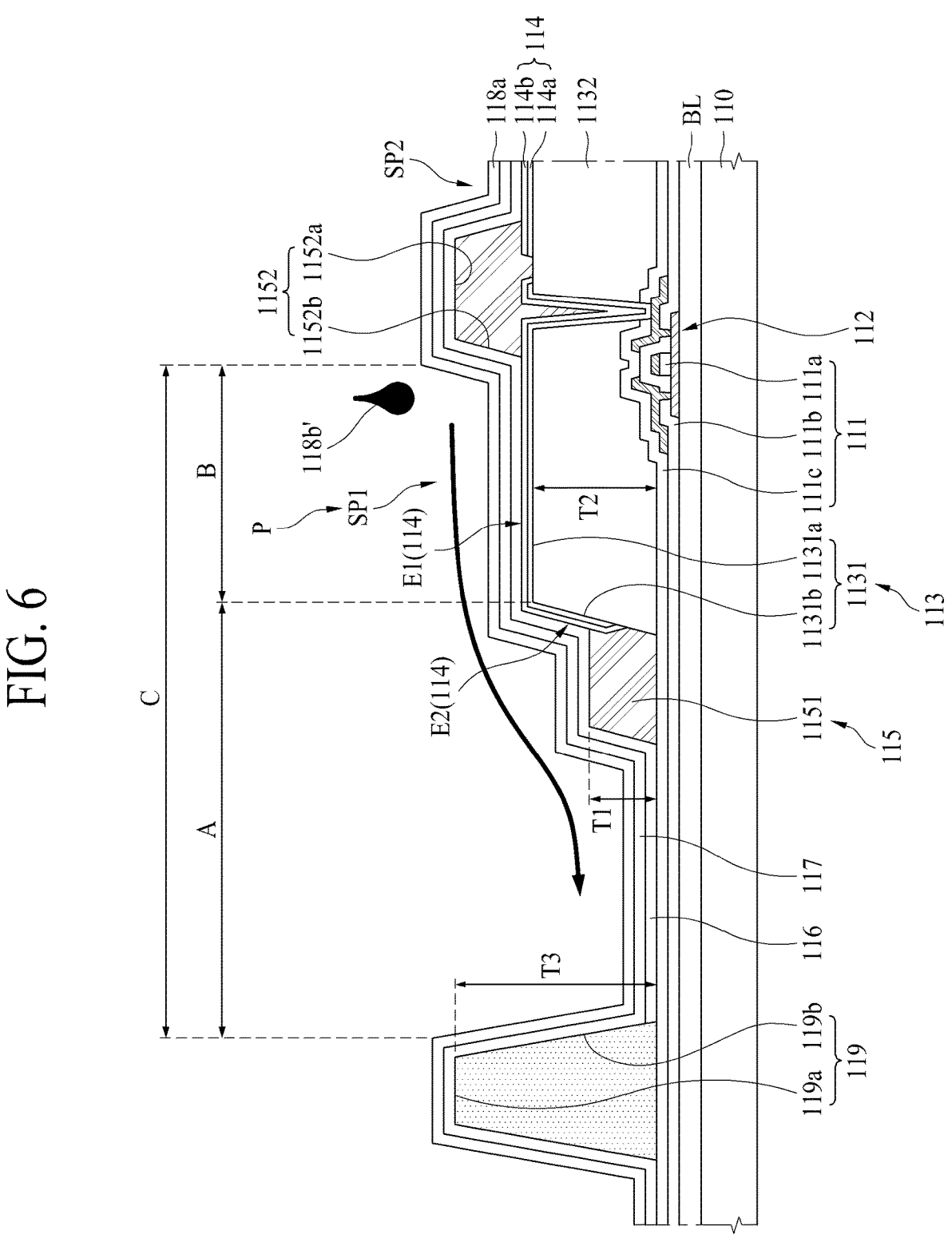
FIG. 6 is a schematic view illustrating that an organic material is coated on a display area of FIG. 5.

FIG. 1 is a perspective view illustrating a display apparatus according to one embodiment of the present disclosure, FIG. 2 is a plan view illustrating a first substrate, a source drive IC, a flexible film, a circuit board and a timing controller of FIG. 1, FIG. 3 is a schematic plan view illustrating the first substrate, FIG. 4 is a schematic enlarged view illustrating a portion A of FIG. 3, FIG. 5 is a schematic cross-sectional view taken along line I-I' shown in FIG. 4, and FIG. 6 is a schematic view illustrating that an organic material is coated on a display area of FIG. 5.

Referring to FIGS. 1 to 6, a display apparatus 100 according to one embodiment of the present disclosure may include a display panel DP, a source drive integrated circuit (IC) 130, a flexible film 140, a circuit board 150, and a timing controller 160.

The display panel DP may include a substrate 110 and an opposite substrate 120, which are bonded to each other. The substrate 110 according to an example may include a gate driver GD, but is not limited thereto.

The substrate 110 may further include a thin film transistor 112. Therefore, the substrate 110 may be a transistor array substrate. As another example, the substrate 110 may be a lower substrate, a base substrate, or a first substrate. The substrate 110 may be a transparent glass substrate or a transparent plastic substrate. For example, the substrate 110 may be a transparent glass substrate. Hereinafter, the substrate 110 will be referred to as the first substrate.

The opposite substrate 120 may be opposite to and bonded to the first substrate 110. For example, the opposite substrate 120 may have a size smaller than that of the first substrate 110, and may be opposite to and bonded to the remaining portion except a pad area PA of the first substrate 110. The opposite substrate 120 may be an upper substrate, a second substrate or an encapsulation substrate. The opposite substrate 120 may be bonded to a first surface of the first substrate 110 by a substrate bonding process using an adhesive member (or transparent adhesive). Hereinafter, the opposite substrate 120 will be referred to as the second substrate.

The first substrate 110 according to an example may include a display area DA and a non-display area NDA.

The display area DA is an area where an image is displayed, and may be a pixel array area, an active area, a pixel array unit or structure, a display unit or structure, or a screen. For example, the display area DA may be disposed at a central portion of the display panel DP.

The display area DA according to an example may include gate lines, data lines, pixel driving power lines, and a plurality of pixels P. Each of the plurality of pixels P may include a plurality of subpixels that may be located at an overlap of the gate lines and the data lines. Each of the plurality of subpixels may have area that is a smallest area of the display area DA in which light is actually emitted.

According to one example, among the plurality of subpixels, four subpixels disposed to be adjacent to one another or four subpixels disposed to be adjacent to one another along a longitudinal direction of the gate lines (or data lines) constitute one unit pixel. One unit pixel may include, but is not limited to, a red subpixel, a green subpixel, a blue subpixel and a white subpixel. As an example, one unit pixel may include at least one red subpixel, at least one green subpixel, at least one blue subpixel and at least one white subpixel.

According to another example, among the plurality of subpixels, three subpixels disposed to be adjacent to one another or three subpixels disposed to be adjacent to one another along a longitudinal direction of the gate lines (or data lines) constitute one unit pixel. One unit pixel may include, but is not limited to, at least one red subpixel, at least one green subpixel, and at least one blue subpixel.

In the present disclosure, for convenience of description, the description will be based on that one pixel P includes a first subpixel SP1 that is a red subpixel, a second subpixel SP2 that is a green subpixel, a third subpixel SP3 that is a blue subpixel, and a fourth subpixel SP4 that is a white subpixel.

Each of the plurality of subpixels may include a thin film transistor, and a light emitting portion connected to the thin film transistor. The light emitting portion may include a light emitting element layer (or organic light emitting layer) interposed between the first electrode and the second electrode.

The light emitting element layers disposed in the respective subpixels may individually emit light of their respective colors different from one another or commonly emit white light. According to one example, when the light emitting element layers of the plurality of subpixels commonly emit white light, each of the red subpixel, the green subpixel and the blue subpixel may include a color filter (or wavelength conversion member) for converting white light into light of its respective different color. In this case, the white subpixel according to one example may not include a color filter. At least a portion of the white subpixel according to another example may include the same color filter as any one of the red subpixel, the green subpixel and the blue subpixel.

Each of the subpixels supplies a predetermined or selected current to the organic light-emitting element in accordance with a data voltage of the data line when a gate signal is input from the gate line by using the thin film transistor. For this reason, the light emitting portion of each of the subpixels may emit light with a predetermined or selected brightness in accordance with a predetermined or selected current. Each of the subpixels SP1, SP2, SP3 and SP4 may include a circuit element layer 111 provided on an upper surface of a buffer layer BL, including a gate insulating layer 111a, an interlayer insulating layer 111b, a protective layer 111c and a thin film transistor 112, a flat portion 113 provided on the circuit element layer 111, a pixel electrode 114 provided on the flat portion 113, a bank 115, an organic light emitting layer 116, a counter electrode 117, and an encapsulation layer 118. The pixel electrode 114, the organic light emitting layer 116 and the counter electrode 117 may be included in the light emitting element.

The buffer layer BL is provided on the first substrate 110, and is intended to prevent moisture penetration into the thin film transistor 112. The buffer layer BL may be formed between the first substrate 110 and the circuit element layer 111 (or gate insulating layer 111a) to protect the thin film transistor 112. The buffer layer BL may be disposed on an entire one surface (or front surface) of the first substrate 110. The buffer layer BL may serve to prevent a material contained in the first substrate 110 from being diffused into a transistor layer during a high temperature process of the manufacturing process of the thin film transistor. Optionally, the buffer layer BL may be omitted as the case may be.

The circuit element layer 111 may include a gate insulating layer 111a, an interlayer insulating layer 111b, a protective layer 111c and a thin film transistor 112. The gate insulating layer 111a, the interlayer insulating layer 111b and the protective layer 111c may be made of an inorganic material.

The thin film transistor 112 according to one example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other to be parallel with each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

Each of the drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor (not shown) may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (not shown) provided below at least one active layer 112a of the thin film transistor 112, the first switching thin film transistor or the second switching thin film transistor. The light shielding layer may be disposed between the first substrate 110 and the active layer 112a to shield light incident on the active layer 112a through the first substrate 110, thereby minimizing a change in the threshold voltage of the transistor due to external light.

The protective layer 111c may be provided on the first substrate 110 to cover the pixel area in which the pixel P is disposed. The protective layer 111c covers the drain electrode 112d and the source electrode 112c of the thin film transistor 112 and the interlayer insulating layer 111b. The protective layer 111c may be entirely formed in the circuit area and the light emission area. For example, the protective layer 111c may be expressed as a passivation layer. The protective layer 111c may be omitted.

The flat portion 113 may be provided on the first substrate 110 to cover the protective layer 111c. When the protective layer 111c is omitted, the flat portion 113 may be provided on the first substrate 110 to cover the circuit area. The flat portion 113 may be formed entirely in the circuit area and the light emission area.

The flat portion 113 according to one example may be formed to be relatively thick, and may provide a flat surface on the display area DA. For example, the flat portion 113 may be made of an organic material such as photo acryl, benzocyclobutene, polyimide and fluorine resin.

The non-display area NDA may be an area where an image is not displayed, and may be a peripheral circuit area, a signal supply area, a non-active area or a bezel area. The non-display area NDA may be provided to be around the display area DA. That is, the non-display area NDA may be disposed to surround the display area DA. It should be understood that "surround" includes the meaning of partially surround or fully surround. "Partially surround" includes the meaning of laterally surround or vertically surround, and includes the meaning that at least one side of the element being surrounded is exposed partially or fully. For example, the non-display area NDA may laterally surround the display area DA on at least four sides for a rectangular shape (see FIG. 2 and FIG. 3), at least six sides for a hexagonal shape, at least eight sides for an octagonal shape, and so on.

The display apparatus 100 according to one embodiment of the present disclosure may include a dam 119 provided in the non-display area NDA.

The dam 119 prevents an organic material for covering foreign materials such as particles, which are likely to occur in the process of manufacturing the first substrate 110 including the pixel P, from overflowing to the outside of the display panel DP beyond the non-display area NDA. Therefore, as shown in FIG. 3, the dam 119 may be disposed to laterally surround the display area DA in the non-display area NDA, and may be thicker than the flat portion 113 provided in the display area DA as shown in FIG. 5.

In order to prevent the pixel P from being damaged due to an error of the manufacturing process, the dam 119 according to an example may be spaced apart from the pixel P, which is disposed at the outermost of the plurality of pixels P provided in the display area DA, as much as a predetermined or selected distance. In this case, the outermost pixel P may mean a pixel P closest to the dam 119 among the plurality of pixels P. A distance between the outermost pixel P and the dam 119 may be included in the non-display area NDA (or bezel area), and may be a beneficial factor that determines the size of the non-display area NDA (or bezel area). Therefore, when the distance between the outermost pixel P and the dam 119 is reduced, the size of the non-display area NDA (or bezel area) may be reduced. Therefore, when a plurality of display apparatuses are disposed to be adjacent to each other, a distance between the plurality of display apparatuses is not recognized by a user, whereby an integrated image may be implemented.

The display apparatus 100 according to one embodiment of the present disclosure includes the flat portion 113 on which the pixel electrode 114 of the outermost pixel P is disposed, and the bank 115 thinner than or equal to the flat portion 113 disposed on a side of the flat portion 113. Therefore, since a coating device is positioned even in the display area DA (or pixel P) to coat an organic material, the size of the non-display area NDA (or bezel area) may be reduced. This will be described later with reference to FIGS. 5 and 6.

Each of the plurality of pixels P provided in the display area DA may include a pixel electrode 114, an organic light emitting layer 116, and a counter electrode 117, and an edge of the pixel electrode 114 of each of the plurality of pixels P may be covered by the bank 115. An area of the pixel electrode 114, which is not covered by the bank 115, may be a light emission area, and an area excluding the light emission area may be a non-light emission area. The bank 115 may be included in the non-light emission area.

At least a portion of the pixel electrode 114 according to an example may be formed on the flat portion 113. The pixel electrode 114 may be a first electrode or an anode electrode. The pixel electrode 114 is connected to the drain electrode or the source electrode of the thin film transistor 112 through a contact hole that passes through the flat portion 113 and the protective layer 111c. The pixel electrode 114 may be formed of at least one of a transparent metal material, a semi-transmissive metal material or a metal material having high reflectance.

When the display apparatus 100 is provided in a top emission mode, the pixel electrode 114 may be formed of a metal material having high reflectance, or a stacked structure of a metal material having high reflectance and a transparent metal material. For example, the pixel electrode 114 may be formed of a stacked structure of a lower electrode 114a and an upper electrode 114b. The lower electrode 114a may be disposed between the flat portion 113 and the upper electrode 114b, and may have a greater coupling force with the flat portion 113 than the upper electrode 114b. The lower electrode 114a according to an example may be provided in a stacked structure (ITO/MoTi/ITO) of MoTi and ITO to increase the coupling force with the flat portion 113. The upper electrode 114b is disposed on an upper surface (or upper side) of the lower electrode 114a, that is, between the lower electrode 114a and the organic light emitting layer 116, and may be provided in a stacked structure (ITO/Ag/ITO) of Ag and ITO. The upper electrode 114b may have reflectance higher than that of the lower electrode 114a in reflecting light emitted from the organic light emitting layer 116.

When the display apparatus 100 is provided in a bottom emission mode, the pixel electrode 114 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

As shown in FIG. 5, since the pixel electrode 114 is provided in the display area DA, the flat portion 113 may be provided below the pixel electrode 114 in the display area DA. The flat portion 113 is provided with a predetermined or selected thickness so as to cover the thin film transistor 112 for allowing the organic light emitting layer 116 to emit light, and thus its upper surface may be flat. Therefore, the pixel electrode 114 provided on the flat portion 113 may be also provided to be flat along a profile of the upper surface of the flat portion 113.

As shown in FIG. 5, the flat portion 113 according to an example may include a flat portion 1131 adjacent to the dam 119 and a flat portion 1132 positioned to be closer to an inner side (or central portion) of the display area DA than the flat portion 1131 adjacent to the dam 119. Hereinafter, the flat portion 1131 adjacent to the dam 119 will be referred to as a first flat portion, and the flat portion 1132 positioned to be closer to the inner side of the display area DA than the first flat portion will be referred to as a second flat portion.

In the display apparatus 100 according to one embodiment of the present disclosure, the pixel electrode 114 may be disposed on the flat portion 113. The pixel electrode 114 according to an example may be provided to fully or partially cover a horizontal surface 1131*a* and an inclined surface 1131*b* of the flat portion 1131. The pixel electrode 114 according to another example may be provided to be in contact with the protective layer 111*c* as well as the flat portion 1131.

As shown in FIG. 5, the pixel electrode 114 according to an example may include a first extension portion E1(114) disposed on a horizontal surface 1131*a* of the first flat portion 1131 and a second extension portion E2(114) disposed on an inclined surface 1131*b* of the first flat portion 1131. In this case, the horizontal surface 1131*a* of the first flat portion 1131 may refer to a surface positioned on an upper side of the first flat portion 1131 and parallel with the upper surface of the first substrate 110. The horizontal surface 1131*a* of the first flat portion 1131 may be an upper surface of the first flat portion 1131. The inclined surface 1131*b* of the first flat portion 1131 may be a surface extended from an end of the horizontal surface 1131*a* of the first flat portion 1131. In more detail, the inclined surface 1131*b* of the first flat portion 1131 may refer to a surface extended from an end of the horizontal surface 1131*a* of the first flat portion 1131 to an upper surface of the protective layer 111*c*. The inclined surface 1131*b* of the first flat portion 1131 may be a side of the first flat portion 1131.

The display apparatus 100 according to one embodiment of the present disclosure may be provided so that the second extension portion E2(114) may partially cover the inclined surface 1131*b* of the first flat portion 1131. As shown in FIG. 5, the second extension portion E2(114) may be connected to one end of the first extension portion E1(114) and provided to cover ⅔ of the inclined surface 1131*b* of the first flat portion 1131 (or left side based on FIG. 5). As the second extension portion E2(114) is partially disposed even on the inclined surface 1131*b* of the first flat portion 1131, the counter electrode 117 and an electric field may be formed even on the inclined surface 111*b* of the flat portion 1131, whereby the organic light emitting layer 116 may emit light.

The bank 115 may be included in the non-light emission area where light is not emitted. The bank 115 may be provided to lateraly surround each of light emission areas (or light emitting portions) of the plurality of subpixels SP1, SP2, SP3 and SP4. That is, the bank 115 may partition (or define) each of the light emission areas (or light emitting portions).

The bank 115 may be formed to cover the edge of the pixel electrode 114, thereby partitioning (or defining) the light emission areas (or light emitting portions) of the plurality of subpixels SP1, SP2, SP3 and SP4.

The bank 115 may be formed to cover the edge of each of the pixel electrodes 114 of the subpixels SP1, SP2, SP3 and SP4 and expose a portion of each of the pixel electrodes 114. Therefore, the bank 115 may prevent light emitting efficiency from being deteriorated due to a current concentrated on an end of each of the pixel electrodes 114. The exposed portion of the pixel electrode 114, which is not covered by the bank 115, may be a light emission area (or light emitting portion).

The bank 115 may be formed of an organic layer such as an acrylic resin, an epoxy resin, a phenolic resin, a polyamide resin and a polyimide resin, but is not limited thereto.

As shown in FIG. 5, in the display apparatus 100 according to one embodiment of the present disclosure, the bank 115 may include a first bank 1151 and a second bank 1152. The first bank 1151 may be disposed between the first flat portion 1131 and the dam 119, and the second bank 1152 may be disposed at a boundary portion between the first subpixel SP1 and the second subpixel SP2 so as to cover a portion of each of the first flat portion 1131 disposed in the first subpixel SP1 and the second flat portion 1132 disposed in the second subpixel SP2. That is, the second bank 1152, rather than the first bank 1151, may be positioned inside the display area DA in a direction toward the display area DA from the non-display area NDA. Therefore, the first bank 1151 may cover an edge of one side of the pixel electrode 114 (or the second extension portion E2(114)) disposed on the inclined surface 1131*b* of the first flat portion 1131 in the first subpixel SP1. The second bank 1152 may cover an edge of the other side of the pixel electrode 114 (or the first extension portion E1(114)) partially disposed on the horizontal surface 1131*a* of the first flat portion 1131 in the first subpixel SP1. Further, the second bank 1152 may cover the edge of one side of the pixel electrode 114 partially disposed on the upper surface (or horizontal plane) of the second flat portion 1132 in the second subpixel SP2.

The first bank 1151 is positioned between the dam 119 and the first flat portion 1131 and provided to cover the edge of the second extension portion E2(114), whereby a right side of the first bank 1151 may be in contact with the second extension portion E2(114) and the inclined surface 1131*b* of the first flat portion 1131 based on FIG. 5. The lower surface of the first bank 1151 may be in contact with the upper surface of the circuit element layer 111, more specifically the upper surface of the protective layer 111*c* based on FIG. 5.

Since the second bank 1152 is disposed on the upper surface of each of the first flat portion 1131 and the second flat portion 1132, the second bank 1152 may be positioned to be higher than the first bank 1151. Therefore, an upper surface 1152*a* of the second bank 1152 may be positioned to be higher than that of the first bank 1151, and a side 1152*b* of the second bank 1152 may also be positioned to be higher than that of the first bank 1151. In this case, the upper surface 1152*a* of the second bank 1152 is a surface positioned on an upper side in the second bank 1152, and the side 1152*b* of the second bank 1152 is a surface extended from an end of the upper surface 1152*a* to the upper surface of the pixel electrode 114 of each of the first subpixel SP1 and the second subpixel SP2. As the second bank 1152 is positioned to be higher than the first bank 1151, even though a liquid organic material 118$b$' constituting the organic layer of the encapsulation layer 118 is coated on the first subpixel SP1, the organic material 118$b$' may be spread toward the first bank 1151 lower than the second bank 1152. Therefore, the organic material 118$b$' may be sufficiently filled between the second bank 1152 and the dam 119.

Since the second bank 1152 may be formed of the same material as that of the first bank 1151 through the same process simultaneously with the first bank 1151, its thickness may be equal to that of the first bank 1151. In this case, the thickness of the second bank 1152 may mean the shortest distance from the upper surface of the pixel electrode 114 disposed on the upper surface of the second flat portion 1132 to the upper surface 1152$a$ of the second bank 1152. In FIG. 5, since a groove formed for connecting the pixel electrode 114 to the thin film transistor 112 is very small, the thickness of the second bank 1152 disposed in the groove may not be included in the thickness of the second bank 1152.

In the display apparatus 100 according to one embodiment of the present disclosure, a thickness T1 of the first bank 1151 may be thinner than or equal to a thickness of the flat portion adjacent to the dam 119, that is, a thickness T2 of the first flat portion 1131.

As shown in FIG. 5, when the thickness T1 of the first bank 1151 is thinner than the thickness T2 of the first flat portion 1131, the upper surface of the first bank 1151 may be positioned to be lower than the horizontal surface 1131$a$ of the first flat portion 1131, whereby the first bank 1151 may be provided in a stepwise structure. Therefore, as shown in FIG. 6, even though the organic material 118$b$' constituting the organic layer of the encapsulation layer 118 is coated on the first subpixel SP1 by a coating device (not shown), the organic material 118$b$' may be spread toward a place lower than the second bank 1152, that is, toward the first flat portion 1131 and the first bank 1151.

Based on FIG. 6, an area between a left end of the horizontal surface 1131$a$ of the first flat portion 1131 and a right end of an upper surface 119$a$ of the dam 119 is referred to as a first area A, and an area between the first area A and the second bank 1152, that is, an area where the horizontal surface 1131$a$ of the first flat portion 1131 is positioned is referred to as a second area B. In this case, the organic material 118$b$' may be spread from the second area B to the first area A to fill a third area C that includes the first area A and the second area B. In case of a general display apparatus, since all banks are disposed on the upper surface of the flat portion, the coating device should coat the organic material only in the first area A so as to fill the organic material of the encapsulation layer in the first area A. When the organic material of the encapsulation layer is coated on another area not the first area A, for example, the second area B, the organic material cannot flow toward the first area A by the bank disposed on the upper surface of the flat portion. For this reason, the organic material cannot be filled in the first area A. Therefore, in case of a general display apparatus, the first area A has no choice but to have a wide size so as to make sure of a coating area of the organic material. However, in the display apparatus 100 according to one embodiment of the present disclosure, as the first bank 1151 is disposed on the inclined surface 1131$b$ not the horizontal surface 1131$a$ of the first flat portion 1131 and the thickness T1 of the first bank 1151 is thinner than the thickness T2 of the first flat portion 1131, even though the organic material 118$b$' of the encapsulation layer is coated on the first subpixel SP1, the organic material 118$b$' may flow to the first area A and then may be filled in the first area A, thereby reducing the size of the first area A. That is, in the display apparatus 100 according to one embodiment of the present disclosure, since the organic material 118$b$' may be coated even in the second area B not the first area A so as to fill the organic material in the first area A, a coating area of the organic material 118$b$' by the coating device may be increased as much as the third area C in which the first area A and the second area B are summed. Therefore, in the display apparatus 100 according to one embodiment of the present disclosure, since the size (or area) of the first area A may be relatively reduced within the range that the coating area of the organic material 118$b$' is increased, the size (or area) of the non-display area NDA (or bezel area) may be reduced.

Although not shown, the display apparatus 100 according to one embodiment of the present disclosure may be formed such that the thickness T1 of the first bank 1151 is equal to the thickness T2 of the first flat portion 1131. In this case, since the upper surface of the first bank 1151 and the horizontal surface 1131$a$ of the first flat portion 1131 are positioned at the same height, the upper surface of the first bank 1151 and the upper surface of the first extension portion E1(114) may be stepped as much as the thickness of the pixel electrode 114. Therefore, the first bank 1151 and the first extension portion E1(114) may be provided in a stepwise structure. Therefore, even in this case, as shown in FIG. 6, even though the organic material 118$b$' constituting the organic layer of the encapsulation layer 118 is coated on the first subpixel SP1, the organic material 118$b$' may be spread toward the first bank 1151 and the second extension portion E2(114) lower than the first extension portion E1(114).

However, as shown in FIG. 5, when the thickness T1 of the first bank 1151 is thinner than the thickness T2 of the first flat portion 1131, a size of a step difference is greater than the case that the thickness T1 of the first bank 1151 is equal to the thickness T2 of the first flat portion 1131, whereby spreading of the organic material 118$b$ from the second area B to the first area A may be further increased and thus a coating process time of the organic material 118$b$' may be further reduced.

Referring back to FIG. 5, the organic light emitting layer 116 is formed on the pixel electrode 114 and the bank 115. When a voltage is applied to the pixel electrode 114 and the counter electrode 117, holes and electrons move to the organic light emitting layer 116, respectively, and are combined with each other in the organic light emitting layer 116 to emit light.

The organic light emitting layer 116 may be formed of a common layer provided on a plurality of subpixels SP1, SP2, SP3 and SP4 and the bank 115. In this case, the organic light emitting layer 116 may be provided in a tandem structure in which a plurality of light emitting layers, for example, a yellow-green light emitting layer and a blue light emitting layer are stacked, and may emit white light when an electric field is formed between the pixel electrode 114 and the counter electrode 117.

A color filter (not shown) corresponding to a color of a corresponding subpixel may be formed on the second substrate 120. For example, a red color filter may be provided in a red subpixel, a green color filter may be provided in a green subpixel, and a blue color filter may be provided in a blue subpixel. A white subpixel may not include a color filter because the organic light emitting layer 116 emits white light.

The counter electrode 117 is formed on the organic light emitting layer 116. The counter electrode 117 may be a second electrode or a cathode electrode. The counter electrode 117 may be a common layer commonly formed in the subpixels. The counter electrode 117 may be formed of a transparent metal material, a semi-transmissive metal material or a metal material having high reflectance.

When the display apparatus 100 is provided in a top emission mode, the counter electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

When the display apparatus 100 includes a bottom emission mode, the counter electrode 117 may be formed of a metal material having high reflectance, such as a stacked structure (Ti/Al/Ti) of aluminum and titanium, a stacked structure (ITO/Al/ITO) of aluminum and ITO, Ag alloy and a stacked structure (ITO/Ag alloy/ITO) of Ag alloy and ITO. The Ag alloy may be an alloy such as silver (Ag), palladium (Pd), copper (Cu), etc.

The encapsulation layer 118 is formed on the counter electrode 117. The encapsulation layer 118 serves to prevent oxygen or moisture from being permeated into the organic light emitting layer 116 and the counter electrode 117. To this end, the encapsulation layer 118 may include at least one inorganic layer and at least one organic layer.

In the display apparatus 100 according to one embodiment of the present disclosure, the encapsulation layer 118 may be disposed even in the non-display area NDA as well as the display area DA. The encapsulation layer 118 according to an example may include a first inorganic layer 118a provided on the counter electrode 117 of the display area DA, an organic layer 118b provided on the first inorganic layer 118a, and a second inorganic layer 118c disposed on the organic layer 118b. The organic layer 118b may be formed to have a thickness sufficient to cover foreign materials (not shown) such as particles, which may occur when a light emitting element including the organic light emitting layer 116 is formed. If there is no organic layer 118b or the organic layer 118b is thin, the first inorganic layer 118a that is thinner than the foreign materials may fail to cover the foreign materials, or even though the first inorganic layer 118a covers the foreign materials, the first inorganic layer 118a covering the foreign materials may be relatively more easily damaged by an external impact to generate cracks than the first inorganic layer 118a positioned so as not to cover the foreign materials, whereby external water or moisture may be easily permeated into the display area DA and thus the light emitting element may be damaged. Therefore, the organic layer 118b of the encapsulation layer 118 may be provided to be thicker than the first inorganic layer 118a or the second inorganic layer 118c to prevent cracks from being easily generated due to an external impact while sufficiently covering the foreign materials.

The organic layer 118b according to an example may be extended to the dam 119, which is provided in the non-display area NDA, as well as the display area DA. This is because that the dam 119 blocks the liquid organic material 118b' coated to form the organic layer 118b from flowing to the outside of the display panel DP. Therefore, as shown in FIG. 5, the organic layer 118b may be disposed in the display area DA and the area between the display area DA and the dam 119.

The first inorganic layer 118a and the second inorganic layer 118c may be provided to be extended to the non-display area NDA as well as the display area DA. For example, the first inorganic layer 118a and the second inorganic layer 118c may be provided to be further extended in an end direction of the first substrate 110 to cover the counter electrode 117 provided to be extended from the display area DA to the non-display area NDA and the dam 119 provided in the non-display area NDA.

As shown in FIG. 5, the first inorganic layer 118a may be disposed between the first substrate 110 (or counter electrode 117) provided in the display area DA and the organic layer 118b and extended to cover the dam 119 provided in the non-display area NDA. Therefore, the first inorganic layer 118a may be provided to cover the entire lower surface of the organic layer 118b and cover the upper surface 119a and the sides 119b of the dam 119. In this case, the upper surface 119a of the dam 119 may refer to a surface positioned at the uppermost side of the dam 119, and the sides 119b of the dam 119 may refer to a plurality of surfaces extended from an end of the upper surface 119a to the upper surface of the protective layer 111c based on FIG. 5. The side 119b of the dam 119 may be an inclined surface, and the upper surface 119a of the dam 119 may be a horizontal plane.

Likewise, the counter electrode 117 may be extended from the display area DA to the non-display area NDA to cover the upper surface 119a and the sides 119b of the dam 119. Thus, as shown in FIG. 5, the counter electrode 117 may be in contact with each of the upper surface 119a and the sides 119b of the dam 119. As a result, the display apparatus 100 according to one embodiment of the present disclosure includes the first inorganic layer 118a made of an inorganic material and the counter electrode 117 made of a metal material, the first inorganic layer 118a and the counter electrode 117 may doubly cover the upper surface 119a and the sides 119b of the dam 119 to prevent external water or moisture from being permeated into the display area DA through the dam 119.

The second inorganic layer 118c may be extended from the display area DA to the non-display area NDA to cover the organic layer 118b, and may be in contact with the first inorganic layer 118a on the dam 119. As shown in FIG. 5, the second inorganic layer 118c may be in contact with the first inorganic layer 118a on the upper surface 119a of the dam 119, and may be further extended to the end of the first substrate 110 along with the first inorganic layer 118a. Therefore, as shown in FIG. 5, the second inorganic layer 118c may be provided to cover the entire upper surface of the organic layer 118b and cover a portion (left side based on FIG. 5) of the upper surface 119a and the side 119b of the dam 119.

As the first inorganic layer 118a and the second inorganic layer 118c are made of the same material, an adhesive force (or coverage) may be more improved than the case that the first inorganic layer 118a and the second inorganic layer 118c are formed of their respective materials different from each other, whereby moisture permeation through the inorganic layer may be more effectively avoided.

As a result, the display apparatus 100 according to one embodiment of the present disclosure may have a structural feature in which the first inorganic layer 118a and the second inorganic layer 118c are in contact with each other between the dam 119 and the end of the first substrate 110, that is, in an outer area that includes the dam 119.

The organic light emitting layer 116 disposed below (or on lower surface of) the first inorganic layer 118a may be extended to the non-display area NDA as well as the display area DA, and may be in contact with the side 119b of the dam 119. However, the organic light emitting layer 116 may be shorter than the first inorganic layer 118a or the counter electrode 117 so as not to cover the dam 119. This is because that external water or moisture may be easily permeated through the organic light emitting layer 116 to damage the light emitting element or shorten lifespan of the light emitting element when the organic light emitting layer 116 is positioned to be close to the outside or exposed to the outside. Therefore, in the display apparatus 100 according to one embodiment of the present disclosure, the organic light emitting layer 116 is extended to the inside of the dam 119 and disposed to be in contact with only the right side 119b of the dam 119 based on FIG. 5, whereby an anti-moisture permeation effect may be improved.

Referring back to FIG. 5, in the display apparatus 100 according to one embodiment of the present disclosure, the thickness T2 of the flat portion adjacent to the dam 119, that is, the thickness T2 of the first flat portion 1131 may be thinner than the thickness T3 of the dam 119. Therefore, as shown in FIG. 6, even though the organic material 118b' is coated on the first subpixel SP1, the organic material 118b' flowing to the first area A may be provided to cover the first inorganic layer 118a disposed on the horizontal surface 1131a of the first flat portion 1131 and the first inorganic layer 118a disposed on the first bank 1151 while being prevented from flowing to the outside of the first substrate 110 beyond the dam 119. As a result, in the display apparatus 100 according to one embodiment of the present disclosure, the thickness T2 of the first flat portion 1131 may be thinner than the thickness T3 of the dam 119, and may be greater than or equal to the thickness T1 of the first bank 1151.

The upper surface 1152a of the second bank 1152 may be positioned at a same height as the upper surface 119a of the dam 119, but is not limited thereto. The upper surface 1152a of the second bank 1152 may be positioned to be higher than the upper surface 119a of the dam 119. This is because that the organic material 118b' may not be sufficiently filled between the first subpixel SP1 and the dam 119 as the organic material 118b' coated on the first subpixel SP1 is coated toward the second subpixel SP2 rather than the first bank 1151 or the dam 119 when the upper surface 1152a of the second bank 1152 is positioned to be lower than the upper surface 119a of the dam 119.

Therefore, in the display apparatus 100 according to one embodiment of the present disclosure, the upper surface 1152a of the second bank 1152 may be positioned to be higher than or equal to the upper surface 119a of the dam 119, so that the organic material 118b' may be prevented from failing to be coated between the second bank 1152 and the dam 119, and the organic material 118b' may be sufficiently filled to cover foreign materials that may be positioned between the second bank 1152 and the dam 119, thereby preventing cracks from occurring in the encapsulation layer 118.

Figure 7:
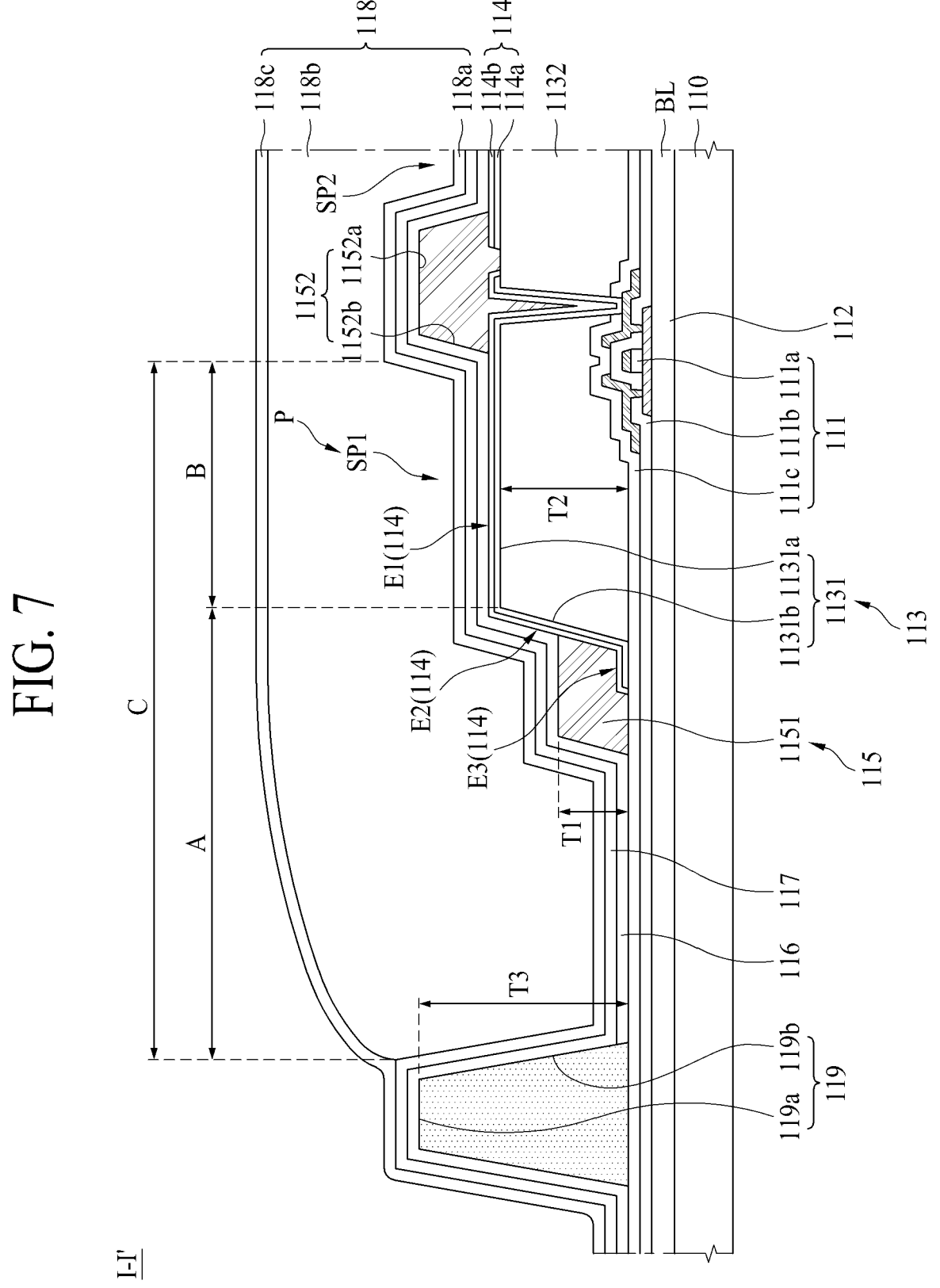
FIG. 7 is a schematic cross-sectional view illustrating a display apparatus according to another embodiment of the present disclosure.

FIG. 7 is a schematic cross-sectional view illustrating a display apparatus according to another embodiment of the present disclosure.

Referring to FIG. 7, the display apparatus 100 according to another embodiment of the present disclosure is the same as the display apparatus 100 shown in FIG. 5 except that at least a portion of the pixel electrode 114 is disposed on the first flat layer 1131 and the structure of the first bank 1151 covering the pixel electrode 114 is changed. Therefore, the same reference numerals will be given for the same elements, and only different elements will be described.

In case of the display apparatus 100 according to FIG. 5, the second extension portion E2(114) provided in the first subpixel SP1 is provided to partially cover the inclined surface 1131b of the first flat portion 1131. Therefore, in case of the display apparatus 100 according to FIG. 5, the right side of the first bank 1151 may be in contact with an edge of the second extension portion E2(114) and a portion of the inclined surface 1131b of the first flat portion 1131. Based on FIG. 5, a lower surface of the first bank 1151 may be in contact with the upper surface of the protective layer 111c.

On the other hand, in case of the display apparatus 100 according to FIG. 7, the second extension portion E2(114) is provided to cover the entire inclined surface 1131b of the first flat portion 1131. The pixel electrode 114 provided in the first subpixel SP1 further includes a third extension portion E3(114) connected to the second extension portion E2(114) and disposed on the upper surface of the protective layer 111c. Therefore, in case of the display apparatus 100 according to FIG. 7, the size of the pixel electrode 114 provided in the first subpixel SP1 may be greater than that of the display apparatus according to FIG. 5. In addition, in case of the display apparatus 100 according to FIG. 7, the right side of the first bank 1151 may be in contact with only a portion of the second extension portion E2(114), and the lower surface of the first bank 1151 may be in contact with the third extension portion E3(114) and the protective layer 111c based on FIG. 7.

As shown in FIG. 7, the third extension portion E3(114) may be disposed between the first bank 1151 and the protective layer 111c, and thus may be in contact with the lower surface of the first bank 1151 and the upper surface of the protective layer 111c. When the first bank 1151 is made of an organic material and the third extension portion E3(114) is not provided, an adhesive force between the protective layer 111c made of an inorganic material and the first bank 1151 made of an organic material may be deteriorated. As shown in FIG. 7, since the third extension portion E3(114) including a metal material is disposed between the first bank 1151 and the protective layer 111c, a coupling force between the first bank 1151 that is an organic material and the protective layer 111c that is an inorganic material may be improved through the third extension portion E3(114).

As a result, in the display apparatus 100 according to another embodiment of the present disclosure, since the coupling force between the first bank 1151 and the protective layer 111c may be improved through the third extension portion E3(114), the first bank 1151 may be prevented from being lost or deformed in shape during the coating process of the organic material 118b', which is a subsequent process.

Figure 8:
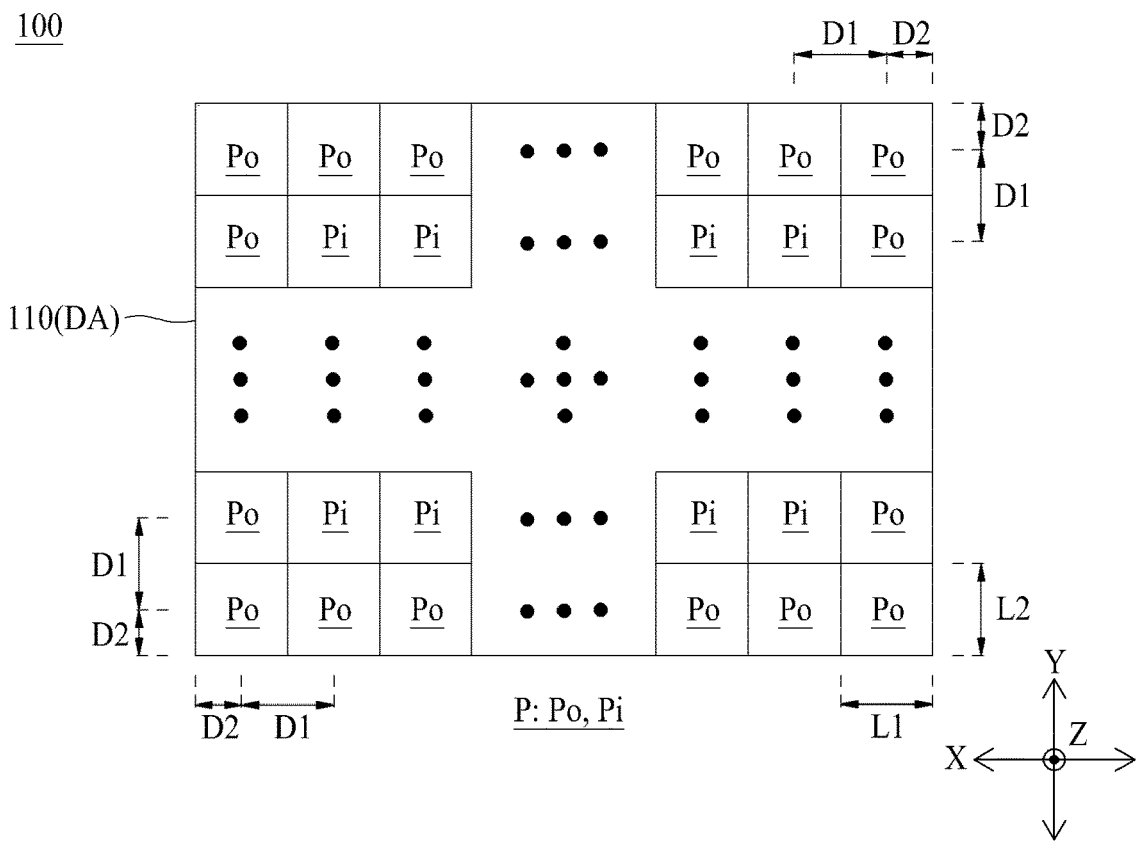
FIG. 8 is a schematic front view illustrating a display apparatus according to one embodiment of the present disclosure.
Figure 9:
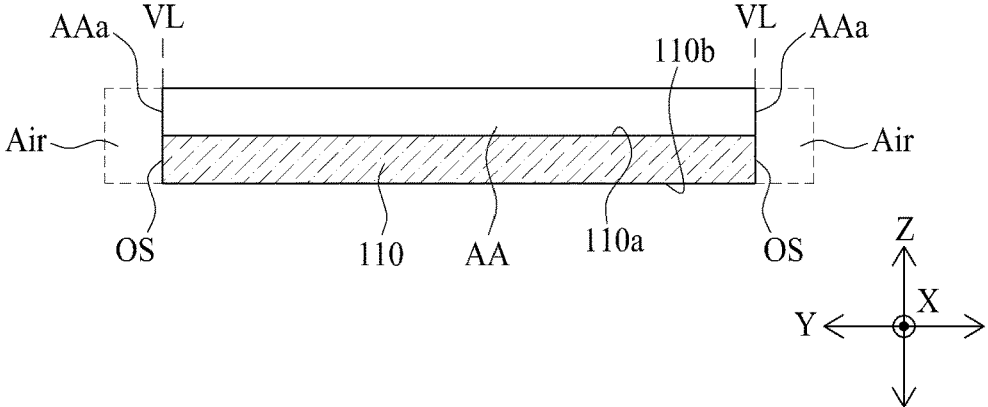
FIG. 9 is a schematic side view illustrating a display apparatus according to one embodiment of the present disclosure.
Figure 10A:
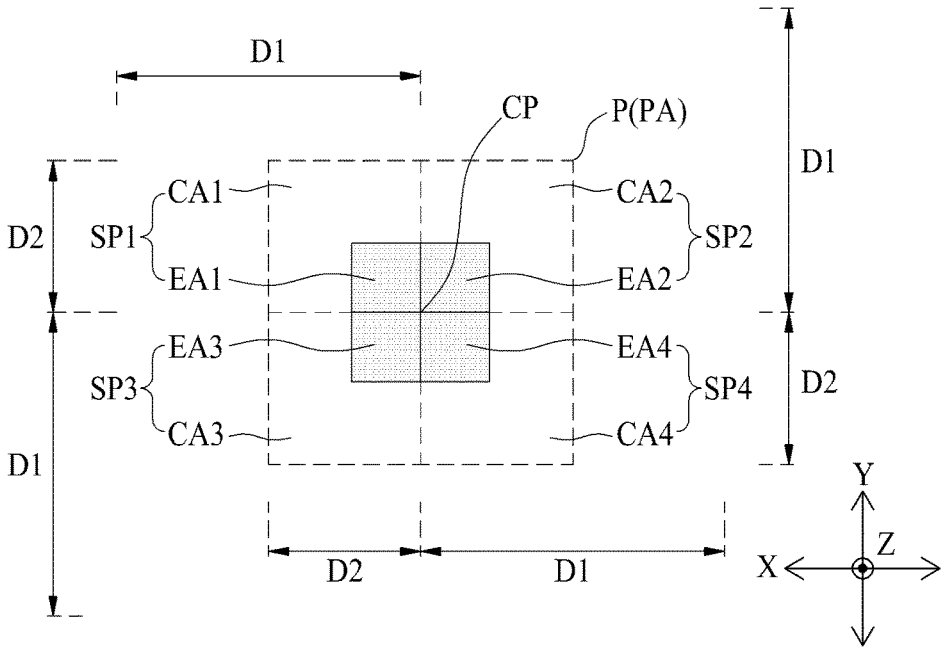
FIG. 10A is a view illustrating one pixel according to one example shown in FIG. 8.
Figure 10B:
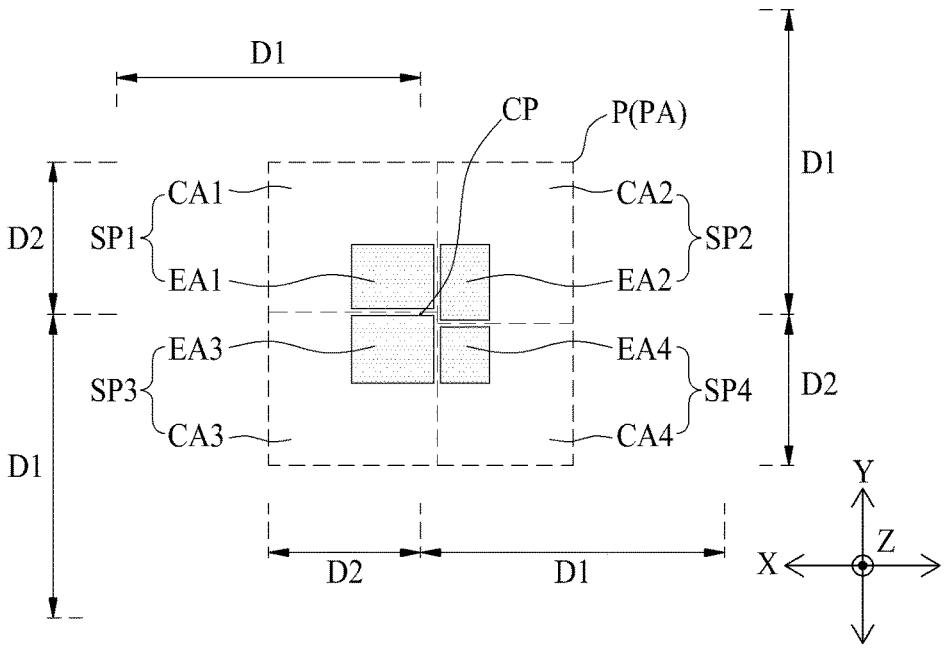
FIG. 10B is a view illustrating one pixel according to another example shown in FIG. 8.

FIG. 8 is a schematic front view illustrating a display apparatus according to one embodiment of the present disclosure, FIG. 9 is a schematic side view illustrating a display apparatus according to one embodiment of the present disclosure, FIG. 10A is a view illustrating one pixel according to one example shown in FIG. 8, and FIG. 10B is a view illustrating one pixel according to another example shown in FIG. 8.

Referring to FIGS. 8 and 9, in the display apparatus 100 according to one embodiment of the present disclosure, the display panel DP may include a first substrate 110 having a display area DA, and a plurality of pixels P formed on the display area DA of the first substrate 110.

In the display apparatus 100 according to one embodiment of the present disclosure, the first substrate 110 may include a display area DA. The display area DA may include a light emission area in which a plurality of pixels are disposed, and a non-light emission area except the light emission area. The dam 119 may be disposed in the non-light emission area. The dam 119 according to an example may be disposed in the non-light emission area surrounding (e.g., laterally surrounding) the outermost pixel Po (shown in FIG. 8) disposed at the outermost of the plurality of pixels.

Although the dam 119 is provided in the non-display area NDA, the dam 119 may be disposed in the non-light emission area of the display area DA. In this case, the display apparatus 100 according to one embodiment of the present disclosure may not include a non-display area NDA. Since the non-display area NDA is not provided, the bank surrounding the outermost pixel Po may be spaced apart from the dam 119 in the non-emission area. In addition, a flat portion (or flat portion adjacent to the dam) provided in the outermost pixel Po may be spaced apart from the dam 119 in the non-light emission area of the display area DA. The bank surrounding the outermost pixel Po may include a first bank, and the first bank may be disposed between a flat portion of the outermost pixel Po and the dam 119. The other features are the same as those of the display apparatus 100 according to the above-described embodiment of the present disclosure, and thus will be omitted. For example, the flat portion (or flat portion adjacent to the dam) provided in the outermost pixel Po may be thinner than the dam, and may be thicker than or equal to the first bank. Hereinafter, the case that the dam 119 is provided in the non-emission area of the display area DA will be described by way of example.

The first substrate 110 may be expressed as a base substrate, or a pixel array substrate. For example, the first substrate 110 may be a glass substrate, a bendable thin glass substrate, or a plastic substrate.

The first substrate 110 according to an example may include a first surface 110a, a second surface 110b, and an outer surface OS. The first surface 110a of the first substrate 110 may be referred to as a front surface, an upper surface, or an upper side surface facing the front of the display apparatus. Here, the first surface 110a of the first substrate 110 may be the front surface of the display panel DP. The second surface 110b of the first substrate 110 may be referred to as a back surface, a rear surface, a lower surface, or a lower side surface facing the rear of the display apparatus. Here, the second surface 110b of the first substrate 110 may be the rear surface of the display panel DP. The outer surface OS of the first substrate 110 may be referred to as a side, a side surface, or a side wall exposed to the air while facing a lateral surface of the display apparatus.

The display area DA may be expressed an area where an image is displayed and may be expressed as an active portion, an active region, or a display region. A size of the display area DA may be the same as the size of the substrate (or display apparatus) 110. For example, the size of the display area DA may be the same as the overall size of the first surface 110a of the first substrate 110. Accordingly, the display area DA is implemented (or disposed) on the entire front surface of the first substrate 110 so that the first substrate 110 does not include a non-display region provided along the edge of the first surface 110a to surround the entire display area DA. Accordingly, the entire front surface of the display apparatus may implement the display area DA.

The end (or outermost) AAa of the display area DA may overlap an outer surface OS of the first substrate 110 or may be aligned with the outer surface OS of the first substrate 110. For example, based on the thickness direction (third direction (Z-axis direction)) of the display apparatus, the lateral surface AAa of the display area DA may be aligned with an extended vertical extension line VL vertically extended from the outer surface OS of the first substrate 110. The lateral surface AAa of the display area DA may be surrounded only by air without being surrounded by a separate mechanism. That is, all of the lateral surfaces AAa of the display area DA may have a structure in direct contact with air without being surrounded by a separate mechanism. Accordingly, since the outer surface OS of the first substrate 110 corresponding to the end AAa of the display area DA is surrounded only by air, the display apparatus 100 according to the embodiment of the present disclosure may have an air-bezel structure in which the end AAa of the display area DA is surrounded by air instead of an opaque non-display region or a structure without a bezel.

The plurality of pixels P may be arranged (or disposed) to have a first interval D1 on the display area DA of the first substrate 110 in each of the first direction (X-axis direction) and the second direction (Y-axis direction). The first direction (X-axis direction) may be a horizontal direction, or a first longitudinal direction (e.g., a horizontal longitudinal direction) of the first substrate 110 or the display apparatus. The second direction (Y-axis direction) may be a vertical direction or may be a second longitudinal direction (e.g., a vertical longitudinal direction) of the first substrate 110 or the display apparatus.

Meanwhile, the dam 119 according to an example may be disposed in the non-light emission area of the outermost pixel Po (shown in FIG. 8) disposed at the outermost of the plurality of pixels. A dam 119 disposed in the non-light emission area may be spaced apart from the bank surrounding the outermost pixel Po. As described above, since the plurality of pixels P may be arranged to have a first interval D1, the dam 119 may be disposed at a position included in the first interval D1 without overlapping the subpixels SP1, SP2, SP3 and SP4. For example, based on FIG. 10A, the dam 119 may be spaced from a left side of the first subpixel SP1 at a predetermined or selected distance within a half of the first interval D1. A pad area PA provided on a first surface 110a of the first substrate 110 may be provided to be disposed on a second surface 110b of the first substrate 110, and when the gate driver GD is provided, the gate driver GD may be implemented (or embedded) in the first surface 110a of the first substrate 110. Therefore, even though display apparatuses 100 according to one embodiment of the present disclosure are disposed to be adjacent to each other, a seam may not be recognized by a user.

Each of the plurality of pixels P may be implemented on a plurality of pixel regions positioned on the display area DA of the first substrate 110. Each of the plurality of pixel regions may have a first length L1 parallel to the first direction (X-axis direction) and a second length L2 parallel to the second direction (Y-axis direction). The first length L1 may be equal to the second length L2 or may be equal to the first interval D1. Each of the first length L1 and the second length L2 may be equal to the first interval D1. Accordingly, the plurality of pixels P may all have the same size. For example, the first length L1 may be expressed as a first width, a horizontal length, or a horizontal width. The second length L2 may be expressed as a second width, a vertical length, or a vertical width.

Two pixels P adjacent in each of the first direction (X-axis direction) and the second direction (Y-axis direction) may have the same first interval D1 within an error range in the manufacturing process. The first interval D1 may be a pitch (or pixel pitch) between two adjacent pixels P. For example, the first interval D1 may be the shortest distance (or the shortest length) between the centers of each of the two adjacent pixels P. Optionally, the pixel pitch may be a size between one end and the other end of the pixel P parallel to the first direction (X-axis direction). Also, in another example, the pixel pitch may be expressed as a size between one end and the other end of the pixel P parallel to the second direction (Y-axis direction).

Each of the plurality of pixels P may include a circuit layer including a pixel circuit implemented in a pixel region on the first substrate 110 and a light emitting device layer disposed on the circuit layer and connected to the pixel circuit. The pixel circuit outputs a data current corresponding to a data signal in response to a data signal and a scan signal supplied from pixel driving lines disposed in the pixel region. The light emitting device layer may include a light emitting layer that emits light by the data current supplied from the pixel circuit.

The plurality of pixels P may be divided into outermost pixels Po and internal pixels Pi.

The outermost pixels Po (or the first pixels) may be pixels disposed closest to the dam 119 or the outer surface OS of the first substrate 110 among the plurality of pixels P. For example, the outermost pixels Po may be expressed as first pixels.

The second distance D2 between the center of the outermost pixels Po and the outer surface OS of the first substrate 110 may be half or less than half the first distance D1. For example, the second distance D2 may be the shortest distance (or the shortest length) between the center of the outermost pixels Po and the outer surface OS of the first substrate 110.

When the second interval D2 exceeds half of the first interval D1, the first substrate 110 have a larger size than the display area DA by a difference between the half of the first interval D1 and the second interval D2, and therefore, the region between the end of the outermost pixel Po and the outer surface OS of the first substrate 110 may be configured as a non-display region surrounding the entire display area DA. For example, when the second interval D2 exceeds half of the first interval D1, the first substrate 110 inevitably includes a bezel region according to the non-display region surrounding the entire display area DA. Therefore, when the plurality of display apparatuses 100 are disposed adjacent to each other, the sum of the second intervals D2 of two first substrates 110 is greater than the first interval D1, so that the bezel region (or seam) between the two first substrates 110 may be recognized by the user.

Meanwhile, when the second interval D2 is half or less than half the first interval D1, the end of the outermost pixel Po may be aligned with the outer surface OS of the first substrate 110 or the end AAa of the display area DA may be aligned with the outer surface OS of the first substrate 110, and thus the display area DA may be implemented (or disposed) on the entire surface of the first substrate 110. Accordingly, even if a plurality of display apparatuses 100 according to an embodiment of the present disclosure are disposed adjacently, a seam may not be recognized by a user.

The internal pixels Pi may be pixels other than the outermost pixels Po among the plurality of pixels P or pixels surrounded by the outermost pixels Po among the plurality of pixels P. The internal pixels Pi may be represented by second pixels. These internal pixels Pi may be implemented in a configuration or structure different from that of the outermost pixel Po.

Referring to FIGS. 8 and 10A, one pixel P according to an embodiment of the present disclosure may include first to fourth sub-pixels SP1, SP2, SP3, and SP4 disposed in the pixel region PA.

The first sub-pixel SP1 may be disposed in a first sub-pixel region of the pixel region PA, the second sub-pixel SP2 may be disposed in a second sub-pixel region of the pixel region PA, the third subpixel SP3 may be disposed in a third subpixel region of the pixel region PA, and the fourth subpixel SP4 may be disposed in a fourth subpixel region of the pixel region PA.

As an example, the first subpixel SP1 may be implemented to emit light of a first color, the second subpixel SP2 may be implemented to emit light of a second color, the third subpixel SP3 may be implemented to emit light of a third color, and the fourth sub-pixel SP4 may be implemented to emit light of the fourth color. Each of the first to fourth colors may be different. For example, the first color may be red, the second color may be blue, the third color may be white, and the fourth color may be green.

As another example, some of the first to fourth colors may be the same. For example, the first color may be red, the second color may be first green, the third color may be second green, and the fourth color may be blue.

Each of the first to fourth sub-pixels SP1, SP2, SP3, and SP4 may include light emitting region EA1, EA2, EA3, and EA4 and circuit regions CA1, CA2, CA3, and CA4.

The light emitting regions EA1, EA2, EA3, and EA4 may be disposed to be shifted toward the center CP of the pixel P in the sub-pixel region. For example, the light emitting regions EA1, EA2, EA3, and EA4 may be expressed as an opening region, an opening, or a light emitting portion.

According to an example, the light emitting regions EA1, EA2, EA3, and EA4 of each of the first to fourth sub-pixels SP1, SP2, SP3, and SP4 may have the same size. For example, each of the light emitting regions EA1, EA2, EA3, and EA4 of the first to fourth subpixels SP1, SP2, SP3, and SP4 may have a uniform quad structure or a uniform stripe structure. For example, the light emitting regions EA1, EA2, EA3, and EA4 having a uniform quad structure or a uniform stripe structure may have a size smaller than a quadrant size of the pixel P and may be disposed to be shifted toward central portion CP in the sub-pixel region or may be disposed to be concentrated in the central portion CP of the pixel P.

Referring to FIGS. 8 and 10B, the light emitting regions EA1, EA2, EA3, and EA4 of each of the first to fourth subpixels SP1, SP2, SP3, and SP4 according to another example may have different sizes. For example, each of the light emitting regions EA1, EA2, EA3, and EA4 of the first to fourth subpixels SP1, SP2, SP3, and SP4 may have a non-uniform quad structure or a non-uniform stripe structure.

The size of each of the first to fourth sub-pixels SP1, SP2, SP3, and SP4 having a non-uniform quad structure (or a non-uniform stripe structure) may be set according to resolution, luminous efficiency, or image quality. As an example, when the light emitting regions EA1, EA2, EA3, and EA4 have an unequal quad structure (or unequal stripe structure), the light emitting region EA4 of the fourth subpixel SP4, among the light emitting regions EA1, EA2, EA3, and EA4 of each of the first to fourth subpixels SP1, SP2, SP3, and SP4 may have the smallest size, and the light emitting region EA3 of the third subpixel SP3 may have the largest size. For example, the light emitting regions EA1, EA2, EA3, and EA4 having a non-uniform quad structure (or a non-uniform stripe structure) may be concentrated around the central portion CP of one pixel P. In one pixel P (or pixel region PA), the central portions of the light emitting regions EA1, EA2, EA3, and EA4 are aligned with the central portion CP of the pixel P or spaced apart from the central portion CP of the pixel P.

The circuit regions CA1, CA2, CA3, and CA4 of each of the first to fourth sub-pixels SP1, SP2, SP3, and SP4 may be disposed around the corresponding light emitting regions EA1, EA2, EA3, and EA4. The circuit regions CA1, CA2, CA3, and CA4 may include a circuit for driving a corresponding sub-pixel and pixel driving lines. For example, the circuit regions CA1, CA2, CA3, and CA4 may be expressed as a non-light-emitting region, a non-opening region, a non-light-emitting portion, a non-opening portion, or a peripheral portion.

Alternatively, in order to increase an aperture ratio of the sub-pixels SP1, SP2, SP3, and SP4 corresponding to the size of the light emitting regions EA1, EA2, EA3, and EA4 or to reduce a pixel pitch D1 according to high resolution of the pixel P, the light emitting regions EA1, EA2, EA3, and EA4 of each of the first to fourth sub-pixels SP1, SP2, SP3, and SP4 may be extended onto the circuit regions CA1, CA2, CA3, and CA4 so as to overlap some or all of the circuit regions CA1, CA2, CA3, and CA4. For example, the light emitting regions EA1, EA2, EA3, and EA4 of each of the first to fourth subpixels SP1, SP2, SP3 and SP4 may be implemented on the first substrate 110 to overlap the corresponding circuit regions CA1, CA2, CA3, and CA4. In this case, the light emitting regions EA1, EA2, EA3, and EA4 may have a size which is the same as or larger than the circuit regions CA1, CA2, CA3, or CA4.

Alternatively, each of the plurality of pixels P according to another example may include first to third sub-pixels SP1, SP2, and SP3.

The light emitting regions EA1, EA2, and EA3 of each of the first to third sub-pixels SP1, SP2, and SP3 may have a rectangular shape having a shorter side parallel to the first direction (X-axis direction) and a longer side parallel to the second direction (Y-axis direction) and may be arranged, for example, in a 1×3 shape or a 1×3 stripe shape. For example, the first subpixel SP1 may be a red subpixel, the second subpixel SP2 may be a blue subpixel, and the third subpixel SP3 may be a green subpixel.

According to the present disclosure, the following advantageous effects may be obtained.

In the present disclosure, as the bank having a thickness thinner than or equal to the thickness of the flat portion is disposed on the side of the flat portion in which the pixel electrode of the pixel is disposed, the coating device may be positioned even in the display area (or pixel) to coat the organic material, whereby the size of the non-display area may be reduced.

Also, in the present disclosure, as the bank having a thickness thinner than or equal to the thickness of the flat portion is disposed on the side of the flat portion in which the pixel electrode of the pixel is disposed, spreading of the coating material coated on the display area (or pixel) to the non-display area through a stepwise structure, may be improved to prevent the organic material from failing to be coated on the non-display area, whereby encapsulation characteristics may be prevented from being deteriorated.

It will be apparent to those skilled in the art that the present disclosure described above is not limited by the above-described embodiments and the accompanying drawings and that various substitutions, modifications and variations may be made in the present disclosure without departing from the spirit or scope of the disclosures. Consequently, it is intended that all variations or modifications derived from the meaning, scope and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
a substrate including:
a display area having a plurality of pixels; and
a non-display area adjacent to the display area and having a dam spaced apart from the plurality of pixels;
a flat portion provided below a pixel electrode of each of the plurality of pixels, the flat portion adjacent to the dam; and
a bank covering an edge of the pixel electrode,
wherein the bank includes a first bank disposed between the flat portion and the dam, and
a thickness of the first bank is less than a thickness of the flat portion adjacent to the dam,
wherein the flat portion includes a horizontal surface parallel to an upper surface of the substrate,
an upper surface of the first bank is lower than the horizontal surface of the flat portion and has a stepwise structure,
wherein the pixel electrode disposed on the flat portion adjacent to the dam includes:
a first extension portion disposed on the horizontal surface of the flat portion adjacent to the dam; and
a second extension portion disposed on an inclined surface of the flat portion adjacent to the dam.

2. The display apparatus of claim 1, wherein the thickness of the flat portion adjacent to the dam is less than a thickness of the dam.

3. The display apparatus of claim 1, wherein the second extension portion partially covers the inclined surface of the flat portion adjacent to the dam.

4. The display apparatus of claim 1, wherein the first bank is in contact with the inclined surface of the flat portion adjacent to the dam and the second extension portion.

5. The display apparatus of claim 1, wherein the second extension portion fully covers the inclined surface of the flat portion adjacent to the dam.

6. The display apparatus of claim 5, further comprising a protective layer disposed below a lower surface of the flat portion,
wherein the pixel electrode further includes a third extension portion connected to the second extension portion and disposed on an upper surface of the protective layer.

7. The display apparatus of claim 6, wherein the first bank is in contact with the third extension portion and the protective layer.

8. The display apparatus of claim 1, wherein each of the plurality of pixels includes:
an organic light emitting layer provided on the pixel electrode and the bank; and
a counter electrode disposed on the organic light emitting layer, wherein the organic light emitting layer is extended to the non-display area and is in contact with sides of the dam, and the counter electrode is extended to the non-display area and is in contact with the sides of the dam and an upper surface of the dam.

9. The display apparatus of claim 8, further comprising an encapsulation layer provided to cover the plurality of pixels provided in the display area, wherein the encapsulation layer includes:

a first inorganic layer disposed on the counter electrode;

an organic layer disposed on the first inorganic layer;

a second inorganic layer disposed on the organic layer, and the organic layer is extended from the display area to the dam.

10. The display apparatus of claim 9, wherein the first inorganic layer is extended from the display area to the non-display area to cover the dam, and the second inorganic layer is extended from the display area to the non-display area to cover the organic layer and is in contact with the first inorganic layer on the dam.

11. A display apparatus comprising:

a substrate including:

a display area having a plurality of pixels; and a non-display area adjacent to the display area and having a dam spaced apart from the plurality of pixels;

a flat portion provided below a pixel electrode of each of the plurality of pixels, the flat portion adjacent to the dam; and a bank covering an edge of the pixel electrode, wherein the bank includes a first bank disposed between the flat portion and the dam, and a thickness of the flat portion is less than a thickness of the dam and is greater than a thickness of the first bank, wherein the flat portion includes a horizontal surface parallel to an upper surface of the substrate, an upper surface of the first bank is lower than the horizontal surface of the flat portion and has a stepwise structure, wherein the pixel electrode disposed on the flat portion adjacent to the dam includes:

a first extension portion disposed on the horizontal surface of the flat portion adjacent to the dam; and a second extension portion disposed on an inclined surface of the flat portion adjacent to the dam.

12. The display apparatus of claim 11, wherein the bank further includes a second bank positioned inside the display area, and the second bank is positioned to be higher than the first bank.

13. The display apparatus of claim 12, wherein a thickness of the second bank is the same as that of the first bank.

14. The display apparatus of claim 12, wherein an upper surface of the second bank is positioned to be higher than or equal to that of the dam.

15. A display apparatus comprising:

a substrate; and a display area having a plurality of pixels disposed on the substrate, wherein the display area includes:

a light emission area in which the plurality of pixels are disposed;

a non-light emission area other than the light emission area;

a dam disposed in the non-light emission area and laterally surrounding an outermost pixel of the plurality of pixels;

a flat portion disposed below the outermost pixel and adjacent to the dam; and a bank surrounding the outermost pixel and separated from the dam, wherein the bank includes a first bank disposed between the flat portion and the dam, wherein the flat portion includes a horizontal surface parallel to an upper surface of the substrate, an upper surface of the first bank is lower than the horizontal surface of the flat portion and has a stepwise structure, wherein a pixel electrode disposed on the flat portion adjacent to the dam includes:

a first extension portion disposed on the horizontal surface of the flat portion adjacent to the dam; and a second extension portion disposed on an inclined surface of the flat portion adjacent to the dam.

16. The display apparatus of claim 15, wherein a size of the display area is the same as that of the substrate.

17. The display apparatus of claim 15, wherein each of the plurality of pixels is arranged on the substrate at a first interval, the first interval is a distance between centers of two adjacent pixels, and a second interval between the center of outermost pixels of the plurality of pixels and an outer surface of the substrate is less than half the first interval.

18. The display apparatus of claim 17, wherein the dam is spaced apart from the bank at a distance within a half of the first interval.

19. The display apparatus of claim 15, wherein a thickness of the flat portion is less than a thickness of the dam and is greater than a thickness of the bank.

* * * * *